United States Patent
Yu et al.

(10) Patent No.: US 6,232,241 B1
(45) Date of Patent: May 15, 2001

(54) PRE-OXIDATION CLEANING METHOD FOR REDUCING LEAKAGE CURRENT OF ULTRA-THIN GATE OXIDE

(75) Inventors: Mo-Chiun Yu, Taipei; Chen-Hua Yu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/547,234

(22) Filed: Apr. 11, 2000

(51) Int. Cl.[7] .................................................. H01L 21/302
(52) U.S. Cl. ......................... 438/749; 438/585; 438/745; 438/753; 438/591
(58) Field of Search .................................. 438/585, 745, 438/749, 750, 753, 591

(56) References Cited

U.S. PATENT DOCUMENTS

| | | | |
|---|---|---|---|
| 5,393,686 | 2/1995 | Yeh et al. ............................... | 437/45 |
| 5,646,074 | * 7/1997 | Chen et al. ........................... | 438/239 |
| 5,681,397 | * 10/1997 | Li ............................................. | 134/2 |
| 5,704,986 | 1/1998 | Chen et al. ........................... | 134/2 |
| 5,709,755 | 1/1998 | Kuo et al. ............................. | 134/1.3 |
| 5,849,104 | 12/1998 | Mohindra et al. .................. | 134/25.4 |
| 5,858,106 | * 1/1999 | Ohmi et al. .............................. | 134/1 |
| 5,878,760 | 3/1999 | Mohindra et al. .................. | 134/95.2 |
| 5,904,574 | * 5/1999 | Nishijima ............................. | 438/758 |

* cited by examiner

Primary Examiner—Trung Dang
(74) Attorney, Agent, or Firm—George O. Saile; Stephen B. Ackerman; Rosemary L. S. Pike

(57) ABSTRACT

A new method of pre-oxidation cleaning of a substrate surface is described. The surface of a semiconductor substrate of a wafer is cleaned using a multiple step cleaning process wherein the final step of the cleaning process comprises cleaning with a solution of $H_2SO_4$ and $H_2O_2$ whereby a chemical oxide initial layer is formed on the surface of the wafer. Thereafter, the surface of the wafer is oxidized to form a thermal oxide layer wherein the chemical oxide layer and the thermal oxide layer together form a gate oxide layer in the fabrication of an integrated circuit.

16 Claims, 3 Drawing Sheets

PRE-OXIDATION CLEANING METHOD FOR REDUCING LEAKAGE CURRENT OF ULTRA-THIN GATE OXIDE

BACKGROUND OF THE INVENTION (1) Field of the Invention

The invention relates to a method of reducing leakage current in the fabrication of integrated circuits, and more particularly, to a method of reducing leakage current of ultra-thin gate oxide by a novel pre-oxidation cleaning sequence in the manufacture of integrated circuits.

(2) Description of the Prior Art

For deep sub-micron CMOS technology, gate oxide has been scaled down aggressively toward the direct tunnelling current region. The thickness of the silicon dioxide layer is projected to be around 15 to 20 Angstroms for the coming 0.13 $\mu$m technology. For such ultra-thin gate oxide, leakage current will increase tremendously as compared to previous technologies. Accordingly, this will cause standby power consumption of devices to rise significantly, making products commercially unacceptable. The leakage current of ultra-thin gate oxides must be reduced.

U.S. Pat. No. 5,393,686 to Yeh et al discloses cleaning a gate oxide layer using ammonia and hydroxide fluid. U.S. Pat. No. 5,709,755 to Kuo et al teaches an APM rinse of the front and back sides of a wafer following CMP. U.S. Pat. No. 5,849,104 to Mohindra et al shows a multi-step cleaning process which can be used as a pre-gate oxide clean. U.S. Pat. No. 5,704,986 to Chen et al teaches a dry cleaning of a semiconductor substrate. U.S. Pat. No. 5,878,760 to Mohindra et al teaches a substrate cleaning process.

SUMMARY OF THE INVENTION

A principal object of the present invention is to provide an effective and very manufacturable method of pre-oxidation cleaning of a substrate surface.

A further object of the invention is to provide a method for pre-oxidation cleaning of a substrate surface that results in an initial chemical oxide layer on the substrate.

In accordance with the objects of this invention a new method of pre-oxidation cleaning of a substrate surface is achieved. The surface of a semiconductor substrate of a wafer is cleaned using a multiple step cleaning process wherein the final step of the cleaning process comprises cleaning with a solution of $H_2SO_4$ and $H_2O_2$ whereby a chemical oxide initial layer is formed on the surface of the wafer. Thereafter, the surface of the wafer is oxidized to form a thermal oxide layer wherein the chemical oxide layer and the thermal oxide layer together form a gate oxide layer in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
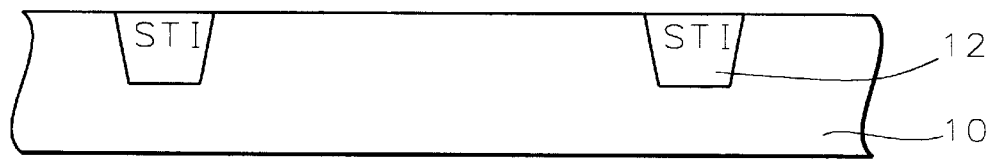
FIGS. 1 and 3 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. Each active region of the integrated circuit device is to be isolated from other active regions. LOCal Oxidation of Silicon (LOCOS) can be used to form Field OXide regions, for example, or Shallow Trench Isolation (STI) regions, such as 12, may be formed.

For deep-submicron CMOS technology, the gate oxide layer must be ultra thin, perhaps on the order of 15 to 20 Angstroms. In order to reduce leakage current, the surface of the semiconductor substrate must be extremely clean before formation of the ultra-thin gate oxide layer.

Figure 2:
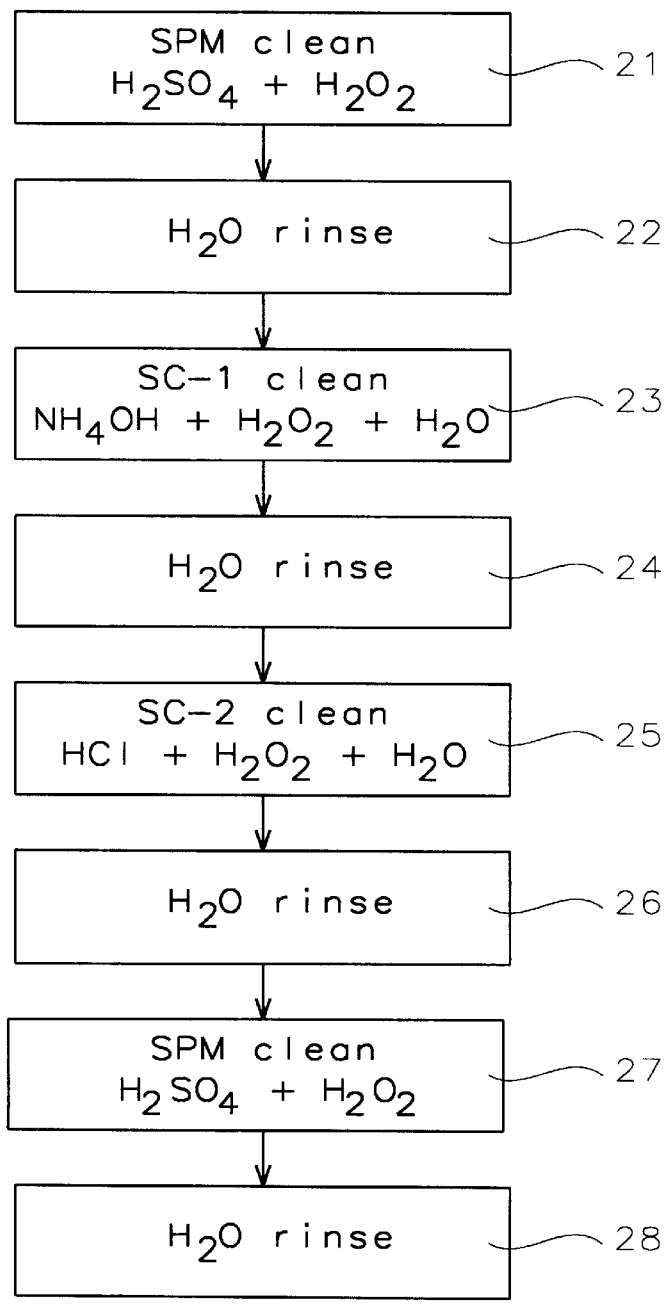
FIG. 2 is a flowchart of a preferred embodiment of the present invention.

For example, FIG. 2 is a flowchart illustrating the cleaning steps in a preferred embodiment of the present invention. First, an SPM clean (21) is performed. The wafer is cleaned using a solution of $H_2SO_4+H_2O_2$. Then the wafer is rinsed with water (22), typically de-ionized water. This first cleaning step removes heavy metal ions and organic materials such as resist.

Next, an SC-1 clean (23) is performed. The SC-1 clean comprises immersing the wafer in a solution of $NH_4OH+H_2O_2+H_2O$. This step is followed by another deionized water rinse (24). SC-1 removes particles and organics.

Next, an SC-2 clean (25) is performed. This clean comprises a solution of $HCl+H_2O_2+H_2O$ and is followed by another water rinse (26). SC-2 removes metal ions and any remaining chemicals.

Now, another SPM clean (27) is performed. This clean comprises $H_2SO_4+H_2O_2$ and is followed by a water rinse (28). This final SPM clean passivates the silicon surface with a thin layer of chemical oxide, on the order of between about 10 to 12 Angstroms in thickness. This chemical oxide layer will protect the silicon surface from being roughened during the high temperature oxidation to follow.

It should be understood that other cleaning steps may be performed and some of the cleaning steps described may be omitted without departing from the spirit and scope of the invention. The key feature of the present invention is that an SPM clean is performed last. The final SPM clean will form a thin layer of chemical oxide of good quality on the silicon surface.

Conventionally, an SPM clean is used to remove photoresist or heavy metal ions. It would not be obvious to add a final SPM step at this point because these materials have already been removed. However, the inventors have discovered a surprisingly dramatic improvement in leakage current when the novel pre-oxidation process of the present invention is used.

Figure 3:
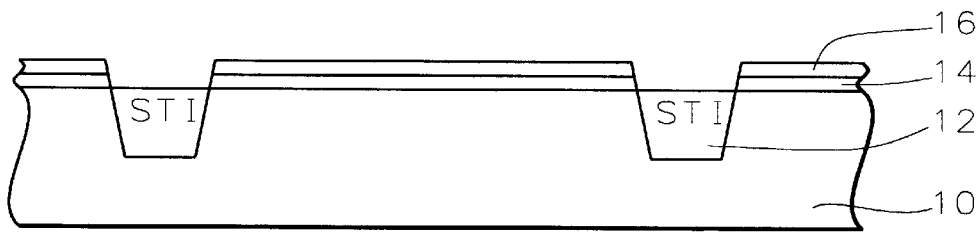

Referring now to FIG. 3, initial chemical oxide layer 14 is shown on the surface of the substrate. Gate oxidation is performed using a rapid thermal process or a furnace process to form gate oxide layer 16. Gate oxide layers 14 and 16 have a combined thickness of between about 15 and 30 Angstroms. It should be noted that the drawing figures are not drawn to scale. The oxide layer 14/16 is very thin.

Using the novel pre-oxidation cleaning process of the present invention, leakage current is reduced about 25% for NMOS and about 10% for PMOS.

Figure 5:
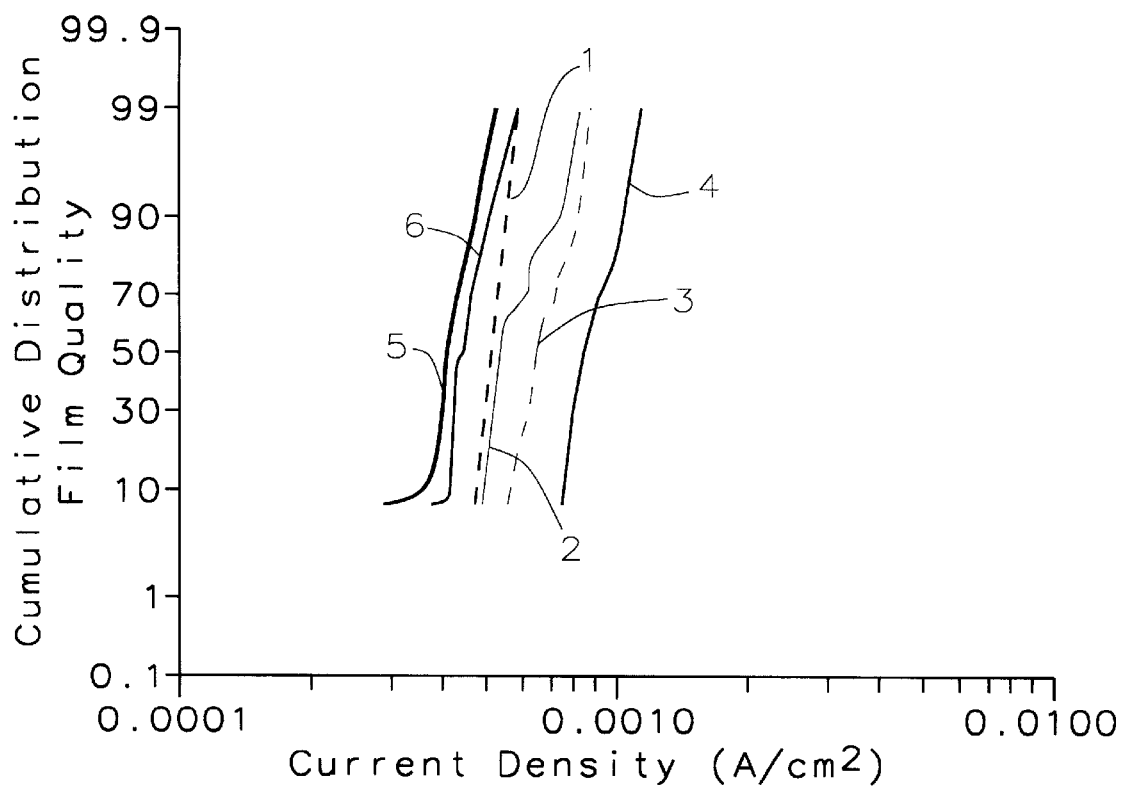
FIGS. 5 and 6 show leakage current density values for test wafers 1 to 6 for both NMOS and PMOS.
Figure 6:
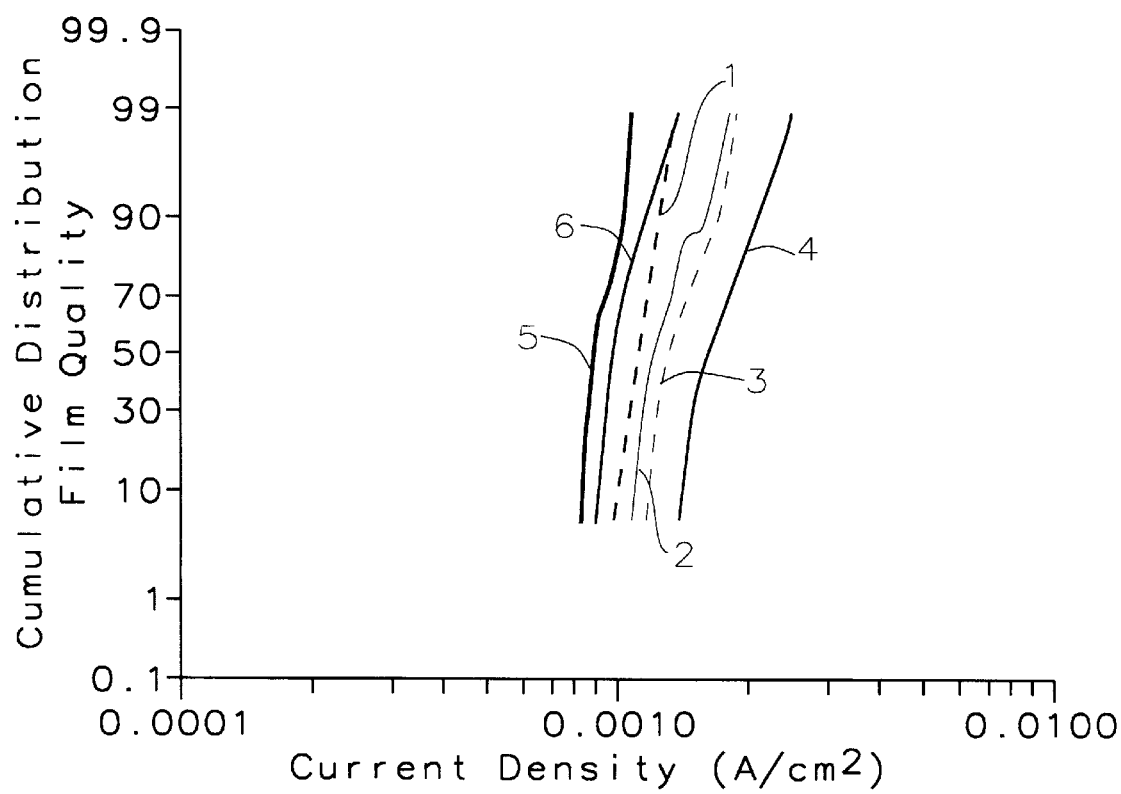

The process of the invention has been implemented and tested. Various pre-oxidation cleaning methods were employed in testing. The leakage current density (Angstroms/cm$^2$) was measured for wafers subjected to each cleaning process. FIG. 5 illustrates the results for NMOS and FIG. 6 illustrates results for PMOS. In both graphs, cumulative distribution of film quality is shown along the vertical axis. The horizontal axis depicts the leakage current density.

Each wafer was cleaned using one of a variety of cleaning methods, then a thin gate oxide layer (about 15 Angstroms)

was grown on the wafer. The electrical thickness of the gate oxide was measured in the inversion mode and is listed in parantheses in the description of each wafer below. All wafers had an almost identical electrical thickness. Current density of the gate oxide was measured for each wafer at 49 points on each wafer.

The test wafers are as follows for both FIGS. 5 and 6:

wafer 1: original cleaning sequence of: SPM+$H_2O$+SC-1+$H_2O$+SC-2+$H_2O$. (NMOS: 23.3, PMOS: 23.3)

wafer 2: original cleaning sequence+$H_2$ anneal (NMOS: 23.3, PMOS: 23.3)

wafer 3: original cleaning sequence+1% HF dip for 1 minute (NMOS: 22.9, PMOS: 23.3)

wafer 4: original cleaning sequence+1% HF dip for 1 minute+$H_2$ anneal (NMOS: 22.7, PMOS: 23.5)

wafer 5: original cleaning sequence+SPM (INVENTION) (NMOS: 23.0, PMOS: 23.5)

wafer 6: original cleaning sequence+$H_2$ anneal at 800° C. for 30 minutes (NMOS: 23.0, PMOS: 23.5)

FIGS. 5 and 6 show that the novel pre-oxidation cleaning process of the present invention (wafer number 5) has the lowest leakage current density values for both NMOS and PMOS.

Figure 4:
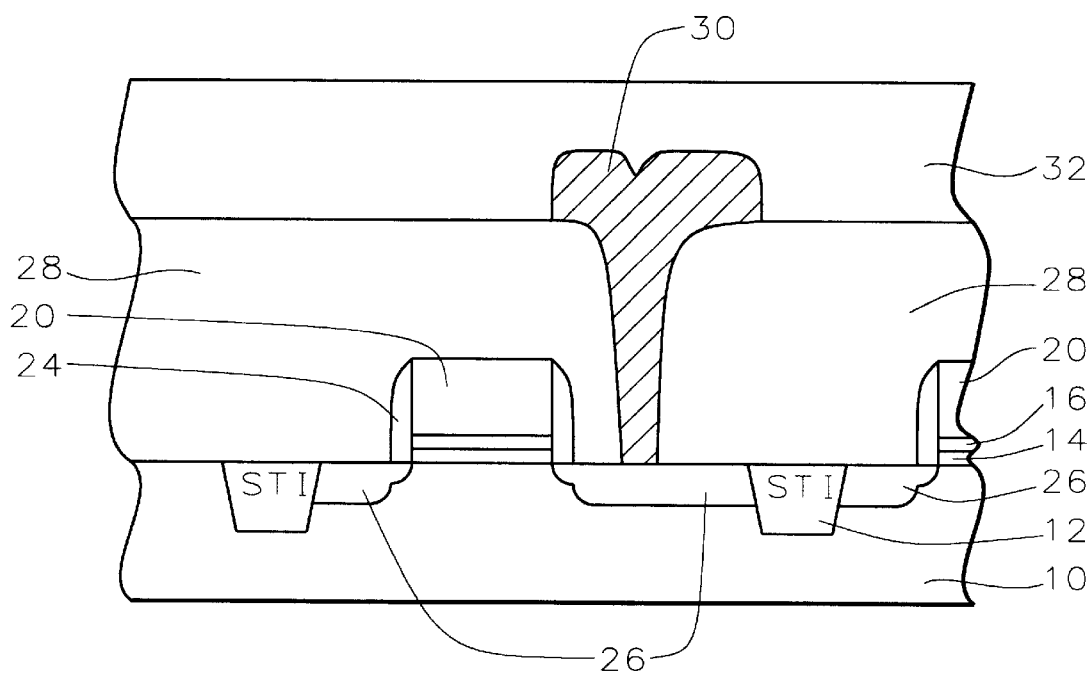
FIG. 4 schematically illustrates in cross-sectional representation a completed integrated circuit device of the present invention.

Processing continues as is conventional in the art. Semiconductor device structures can be fabricated in the active areas over the gate oxide layer 14/16. For example, FIG. 4 illustrates gate electrodes 20 having sidewall spacers 24, source and drain regions 26, a conducting layer 30 contacting one of the source and drain regions through an insulating layer 28 and a passivation layer 32.

The process of the present invention provides a simple and effective method of reducing leakage current, especially for ultra-thin gate oxide. The novel pre-oxidation cleaning process of the present invention performs an SPM clean as the last cleaning step thereby forming an initial chemical oxide layer before the formation of the thermal gate oxide. The chemical oxide layer acts as a buffer layer to prevent silicon surface roughening during thermal oxidation.

While the invention has been particularly shown and described with reference to the preferred embodiments thereof, it will be understood by those skilled in the art that various changes in form and details may be made without departing from the spirit and scope of the invention.

What is claimed is:

1. A method of forming a gate oxide layer in the fabrication of an integrated circuit on a wafer comprising:
    cleaning the surface of a semiconductor substrate of said wafer with a multiple step cleaning process wherein a final step of said multiple step cleaning process comprises cleaning with a solution comprising $H_2SO_4$ and $H_2O_2$ whereby a chemical oxide initial layer is formed on said surface of said wafer; and
    thereafter oxidizing said surface of said wafer to form a thermal oxide layer wherein said chemical oxide layer and said thermal oxide layer together form said gate oxide layer in the fabrication of said integrated circuit.

2. The method according to claim 1 wherein said step of cleaning said surface of said wafer comprises cleaning with a solution comprising $H_2SO_4$ and $H_2O_2$.

3. The method according to claim 1 wherein said multiple step cleaning process comprises:
    cleaning with a solution of $H_2SO_4$+$H_2O_2$;
    cleaning with $NH_4OH$+$H_2O_2$+$H_2O$;
    cleaning with $HCl$+$H_2O_2$+$H_2O$; and
    $H_2O$ rinsing after each cleaning step.

4. The method according to claim 1 wherein said step of cleaning said surface of said wafer comprises:
    cleaning with a solution of $H_2SO_4$+$H_2O_2$;
    cleaning with $NH_4OH$ +$H_2O_2$+$H_2O$;
    cleaning with $HCl$+$H_2O_2$+$H_2O$; and
    $H_2O$ rinsing after each cleaning step wherein a final cleaning step comprises cleaning with a solution comprising $H_2SO_4$ and $H_2O_2$.

5. The method according to claim 1 wherein said chemical oxide initial layer has a thickness of between about 10 and 12 Angstroms.

6. The method according to claim 1 wherein said thermal oxide layer is formed by one of the group containing rapid thermal processing and furnace processing.

7. The method according to claim 1 wherein said thermal oxide layer has a thickness of between about 15 and 30 Angstroms.

8. The method according to claim 1 wherein said chemical oxide initial layer and said thermal oxide layer together have a thickness of between about 15 and 30 Angstroms.

9. A method of forming a gate oxide layer in the fabrication of an integrated circuit on a wafer comprising:
    cleaning the surface of a semiconductor substrate of said wafer with a multiple step cleaning process comprising:
        cleaning with a solution of $H_2SO_4$+$H_2O_2$;
        cleaning with $NH_4O_2$+$H_2O_2$+$H_2O$;
        cleaning with $HCl$+$H_2O_2$+$H_2O$; and
        $H_2O$ rinsing after each cleaning step wherein a final step of said multiple step cleaning process comprises cleaning with a solution comprising $H_2SO_4$ and $H_2O_2$ whereby a chemical oxide initial layer is formed on said surface of said wafer; and
    thereafter oxidizing said surface of said wafer to form a thermal oxide layer wherein said chemical oxide layer and said thermal oxide layer together form said gate oxide layer in the fabrication of said integrated circuit.

10. The method according to claim 9 wherein said chemical oxide initial layer has a thickness of between about 10 and 12 Angstroms.

11. The method according to claim 9 wherein said thermal oxide layer is formed by rapid thermal processing or furnace processing to a thickness of between about 15 and 30 Angstroms.

12. The method according to claim 9 wherein said chemical oxide initial layer and said thermal oxide layer together have a thickness of between about 15 and 30 Angstroms.

13. A method of forming a gate oxide layer in the fabrication of an integrated circuit on a wafer comprising:
    cleaning the surface of a semiconductor substrate of said wafer using a multiple step cleaning process wherein a final step of said multiple step cleaning process is a cleaning with a solution comprising $H_2SO_4$ and $H_2O_2$ whereby a chemical oxide initial layer is formed on said surface of said wafer; and
    thereafter oxidizing said surface of said wafer to form a thermal oxide layer wherein said chemical oxide layer and said thermal oxide layer together form said gate oxide layer having a thickness of between 15 and 30 Angstroms in the fabrication of said integrated circuit.

14. The method according to claim 13 wherein said multiple step cleaning process comprises:
    cleaning with a solution of $H_2SO_4$+$H_2O_2$;
    cleaning with $NH_4OH$+$H_2O_2$+$H_2O$;
    cleaning with $HCl$+$H_2O_2$+$H_2O$; and
    $H_2$ rinsing after each cleaning step.

15. The method according to claim 13 wherein said chemical oxide initial layer has a thickness of between about 10 and 12 Angstroms.

16. A method according to claim 13 wherein said thermal oxide layer is formed by rapid thermal processing or furnace processing to a thickness of between about 15 and 30 Angstroms.

* * * * *